(12) United States Patent
Lin et al.

(10) Patent No.: US 9,318,455 B2
(45) Date of Patent: Apr. 19, 2016

(54) METHOD OF FORMING A PLURALITY OF BUMPS ON A SUBSTRATE AND METHOD OF FORMING A CHIP PACKAGE

(71) Applicant: TAIWAN SEMICONDUCTOR MANUFACTURING COMPANY, LTD., Hsinchu (TW)

(72) Inventors: Jing-Cheng Lin, Hsinchu County (TW); Po-Hao Tsai, Zhongli (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 170 days.

(21) Appl. No.: 14/151,855

(22) Filed: Jan. 10, 2014

(65) Prior Publication Data
US 2014/0127863 A1    May 8, 2014

Related U.S. Application Data

(62) Division of application No. 13/308,162, filed on Nov. 30, 2011, now Pat. No. 8,653,658.

(51) Int. Cl.
*H01L 23/00* (2006.01)
*H01L 21/56* (2006.01)
(Continued)

(52) U.S. Cl.
CPC ............ *H01L 24/11* (2013.01); *H01L 21/563* (2013.01); *H01L 23/49811* (2013.01); *H01L 24/13* (2013.01); *H01L 24/14* (2013.01); *H01L 24/16* (2013.01); *H01L 21/486* (2013.01); *H01L 23/147* (2013.01); *H01L 23/49816* (2013.01); *H01L 23/49827* (2013.01); *H01L 25/0655* (2013.01); *H01L 2224/0401* (2013.01); *H01L 2224/05022* (2013.01); *H01L 2224/05124* (2013.01); *H01L 2224/05147* (2013.01); *H01L 2224/05166* (2013.01); *H01L 2224/05572* (2013.01); *H01L 2224/05582* (2013.01); *H01L 2224/05647* (2013.01); *H01L 2224/119* (2013.01); *H01L 2224/1146* (2013.01); *H01L 2224/1147* (2013.01); *H01L 2224/1184* (2013.01);
(Continued)

(58) Field of Classification Search
CPC ......... H01L 24/11; H01L 24/13; H01L 24/14; H01L 24/16; H01L 21/563
See application file for complete search history.

(56) References Cited

U.S. PATENT DOCUMENTS

| | | | |
|---|---|---|---|
| 4,811,082 | A | 3/1989 | Jacobs et al. |
| 4,990,462 | A | 2/1991 | Sliwa, Jr. |

(Continued)

FOREIGN PATENT DOCUMENTS

| | | |
|---|---|---|
| TW | 434856 | 5/2001 |
| TW | 200723416 | 6/2007 |

(Continued)

*Primary Examiner* — Peniel M Gumedzoe
(74) *Attorney, Agent, or Firm* — Hauptman Ham, LLP

(57) ABSTRACT

A method of forming a plurality of bump structures on a substrate includes forming an under bump metallurgy (UBM) layer on the substrate, wherein the UBM layer contacts metal pads on the substrate. The method further includes forming a photoresist layer over the UBM layer, wherein the photoresist layer defines openings for forming the plurality of bump structures. The method further includes plating a plurality of layers in the openings, wherein the metal layers are part of the plurality of bump structures. The method further includes planarizing the plurality of bump structures after the metal layers are plated to a targeted height from a surface of the substrate.

20 Claims, 11 Drawing Sheets

(51) Int. Cl.
*H01L 23/498* (2006.01)
*H01L 25/065* (2006.01)
*H01L 23/14* (2006.01)
*H01L 21/48* (2006.01)

(52) U.S. Cl.
CPC ............ *H01L2224/13083* (2013.01); *H01L 2224/13111* (2013.01); *H01L 2224/13113* (2013.01); *H01L 2224/13116* (2013.01); *H01L 2224/13147* (2013.01); *H01L 2224/13155* (2013.01); *H01L 2224/1403* (2013.01); *H01L 2224/16238* (2013.01); *H01L 2224/32225* (2013.01); *H01L 2224/73204* (2013.01); *H01L 2924/00014* (2013.01); *H01L 2924/351* (2013.01)

(56) References Cited

U.S. PATENT DOCUMENTS

| | | | |
|---|---|---|---|
| 5,075,253 A | 12/1991 | Sliwa, Jr. | |
| 5,380,681 A | 1/1995 | Hsu | |
| 5,481,133 A | 1/1996 | Hsu | |
| 5,633,535 A | 5/1997 | Chao et al. | |
| 5,933,323 A | 8/1999 | Bhaita et al. | |
| 6,002,177 A | 12/1999 | Gaynes et al. | |
| 6,150,255 A | 11/2000 | Downes et al. | |
| 6,172,874 B1 | 1/2001 | Bartilson | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,366,462 B1 | 4/2002 | Chu et al. | |
| 6,434,016 B2 | 8/2002 | Zeng et al. | |
| 6,443,351 B1 | 9/2002 | Huang et al. | |
| 6,448,661 B1 | 9/2002 | Kim et al. | |
| 6,461,895 B1 | 10/2002 | Liang et al. | |
| 6,562,653 B1 | 5/2003 | Ma et al. | |
| 6,570,248 B1 | 5/2003 | Ahn et al. | |
| 6,600,222 B1 | 7/2003 | Levardo | |
| 6,607,938 B2 | 8/2003 | Kwon et al. | |
| 6,611,057 B2 | 8/2003 | Mikubo et al. | |
| 6,661,085 B2 | 12/2003 | Kellar et al. | |
| 6,717,812 B1 | 4/2004 | Pinjala et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |
| 7,015,572 B2 | 3/2006 | Yamaji | |
| 7,037,804 B2 | 5/2006 | Kellar et al. | |
| 7,056,807 B2 | 6/2006 | Kellar et al. | |
| 7,057,270 B2 | 6/2006 | Moshayedi | |
| 7,087,538 B2 | 8/2006 | Staines et al. | |
| 7,151,009 B2 | 12/2006 | Kim et al. | |
| 7,157,787 B2 | 1/2007 | Kim et al. | |
| 7,180,165 B2 | 2/2007 | Ellsberry et al. | |
| 7,215,033 B2 | 5/2007 | Lee et al. | |
| 7,276,799 B2 | 10/2007 | Lee et al. | |
| 7,279,795 B2 | 10/2007 | Periaman et al. | |
| 7,307,005 B2 | 12/2007 | Kobrinsky et al. | |
| 7,317,256 B2 | 1/2008 | Williams et al. | |
| 7,320,928 B2 | 1/2008 | Kloster et al. | |
| 7,345,350 B2 | 3/2008 | Sinha | |
| 7,362,580 B2 | 4/2008 | Hua et al. | |
| 7,402,442 B2 | 7/2008 | Condorelli et al. | |
| 7,402,515 B2 | 7/2008 | Arana et al. | |
| 7,410,884 B2 | 8/2008 | Ramanathan et al. | |
| 7,432,592 B2 | 10/2008 | Shi et al. | |
| 7,494,845 B2 | 2/2009 | Hwang et al. | |
| 7,528,494 B2 | 5/2009 | Furukawa et al. | |
| 7,531,890 B2 | 5/2009 | Kim | |
| 7,557,597 B2 | 7/2009 | Anderson et al. | |
| 7,576,435 B2 | 8/2009 | Chao | |
| 7,611,923 B2 | 11/2009 | Fasano et al. | |
| 7,834,450 B2 | 11/2010 | Kang | |
| 2003/0114024 A1 | 6/2003 | Miyagawa | |
| 2004/0190255 A1 | 9/2004 | Cheon | |
| 2005/0067694 A1 | 3/2005 | Pon et al. | |
| 2006/0126309 A1 | 6/2006 | Bolle et al. | |
| 2007/0007665 A1 | 1/2007 | Clevenger et al. | |
| 2007/0096327 A1 | 5/2007 | Kawamura et al. | |
| 2007/0184579 A1* | 8/2007 | Huang | H01L 24/11 438/106 |
| 2007/0230153 A1* | 10/2007 | Tanida | H01L 24/16 361/809 |
| 2007/0241449 A1 | 10/2007 | Colbert et al. | |
| 2008/0073795 A1 | 3/2008 | Kohl et al. | |
| 2008/0225493 A1 | 9/2008 | Barth | |
| 2009/0052134 A1 | 2/2009 | Casteel et al. | |
| 2009/0294954 A1 | 12/2009 | Bakir et al. | |
| 2010/0019377 A1 | 1/2010 | Arvelo et al. | |
| 2010/0117209 A1 | 5/2010 | Bezama et al. | |
| 2010/0127390 A1 | 5/2010 | Barth | |
| 2010/0187682 A1 | 7/2010 | Pinjala et al. | |
| 2010/0187683 A1 | 7/2010 | Bakir et al. | |
| 2011/0092064 A1 | 4/2011 | Liu et al. | |
| 2011/0101527 A1 | 5/2011 | Cheng et al. | |
| 2011/0205708 A1 | 8/2011 | Andry et al. | |
| 2011/0227216 A1* | 9/2011 | Tseng | H01L 24/05 257/737 |
| 2012/0007232 A1* | 1/2012 | Haba | H01L 21/4853 257/737 |

FOREIGN PATENT DOCUMENTS

| | | |
|---|---|---|
| TW | 200952093 | 12/2009 |
| WO | 2010150912 | 12/2010 |

* cited by examiner

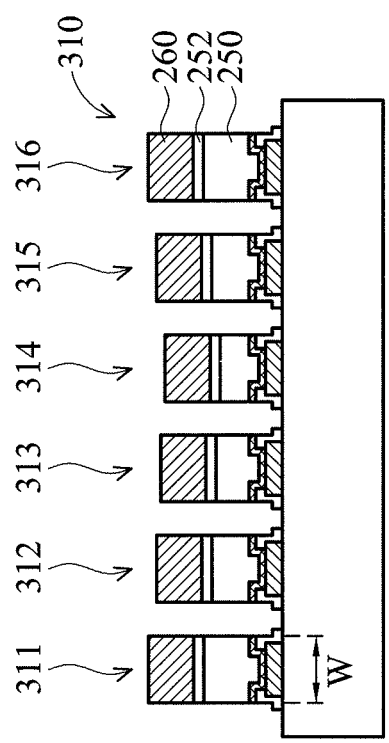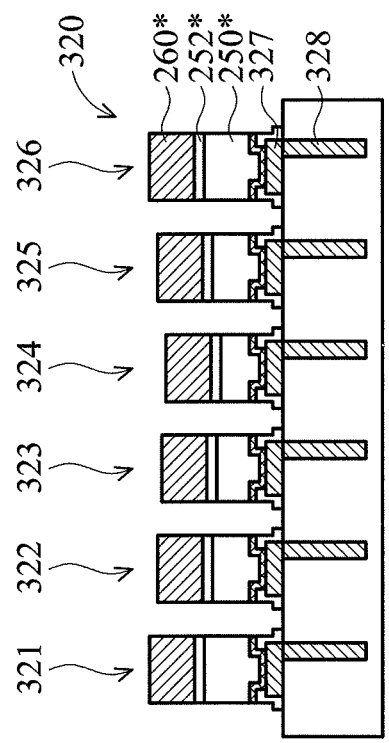

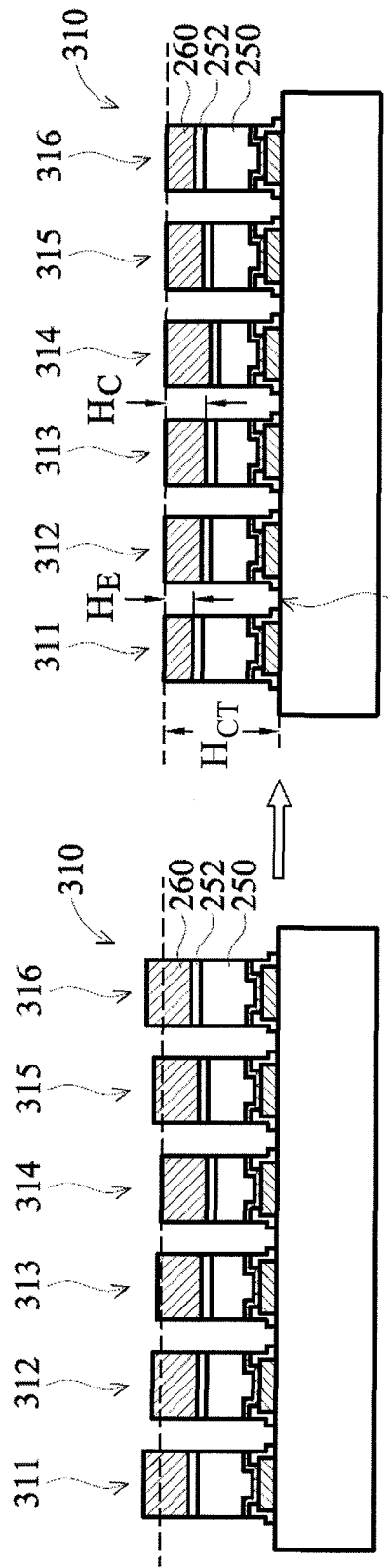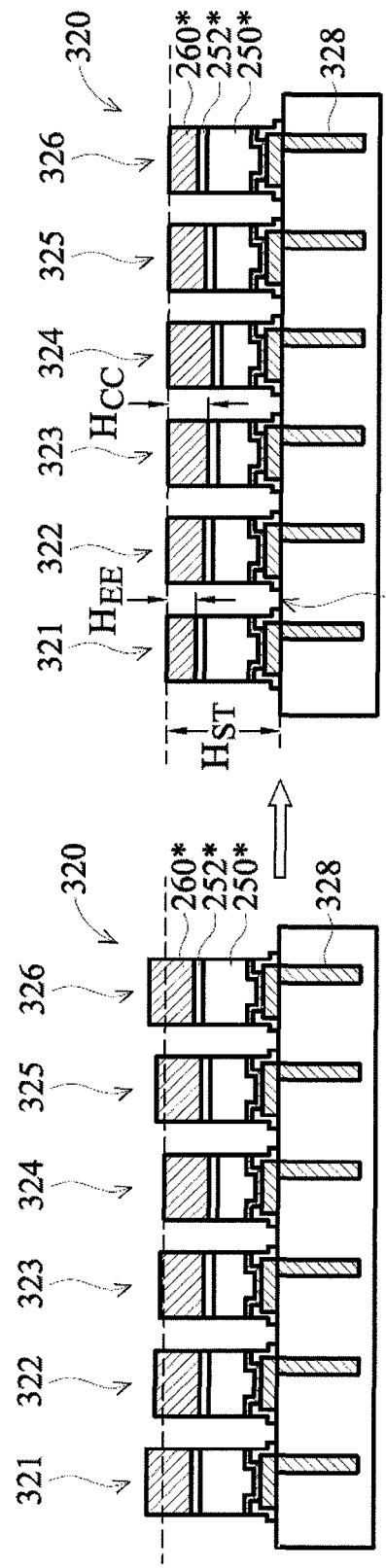
Fig. 4A
Fig. 4B

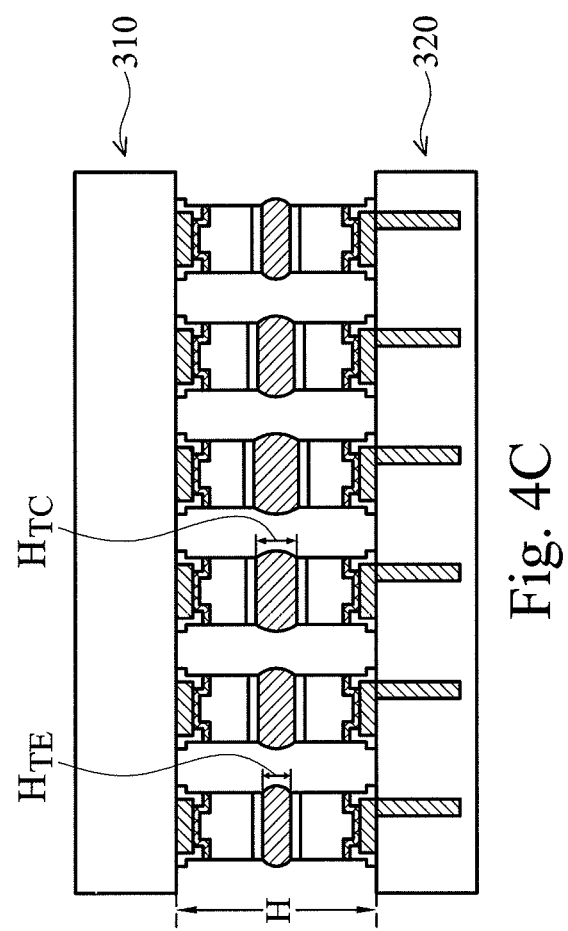

METHOD OF FORMING A PLURALITY OF BUMPS ON A SUBSTRATE AND METHOD OF FORMING A CHIP PACKAGE

PRIORITY CLAIM

The present application is a divisional of U.S. application Ser. No. 13/308,162, filed Nov. 30, 2011, which is incorporated by reference herein in its entirety.

BACKGROUND

The fabrication of modern circuits typically involves several steps. Integrated circuits are first fabricated on a semiconductor wafer, which contains multiple duplicated semiconductor chips, each comprising integrated circuits. The semiconductor chips are then sawed (or diced) from the wafer and packaged. The packaging processes have two main purposes: to protect delicate semiconductor chips, and to connect interior integrated circuits to exterior connections.

In packaging processes, a semiconductor die (or chip) is mounted on a package component using flip-chip bonding. An underfill is dispensed into the gap between the semiconductor die and the package component to prevent cracks from being formed in solder in bumps or balls, wherein cracks are typically caused by thermal stresses. Underfill also reduces delamination at dielectric interface. The package component is an interposer that includes metal connections for routing electrical signals between opposite sides. The die is bonded to the interposer through direct metal bonding, solder bonding, or the like. The package component may also be other types of substrates. There are many challenges in die packaging.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 3B and 3C show cross sectional views of a chip and a substrate after a solder layer is plated on the chip and the substrate respectively, in accordance with some embodiments.

FIGS. 4A and 4B show solders layer being planarized from bump structures, in accordance with some embodiments.

FIG. 4C shows the planarized bump structures of a chip being bonded to the bump structures of a substrate, in accordance with some embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Figure 1:
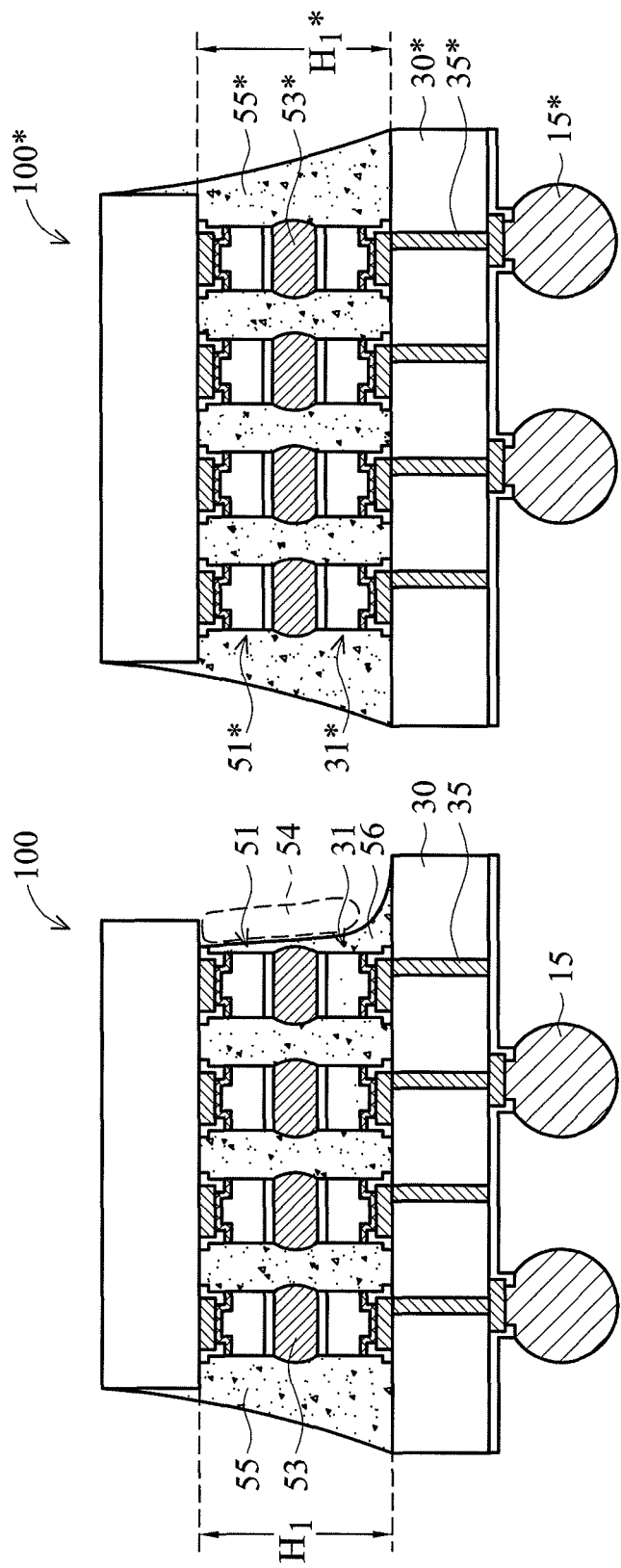
FIG. 1 depicts in a cross-sectional view of two chip packages with integrated circuit (IC) dies on two separate substrates, in accordance with some embodiments.

FIG. 1 depicts in a cross-sectional view of a chip package 100 with an integrated circuit (IC) die 50 on a substrate 30 and a chip package 100* with in IC die 50* on a substrate 30*, in accordance with some embodiments. Package 100 is similar to package 100* with substrates 30 and 30* being similar and IC dies 50 and 50* being similar. In some embodiments, substrates 30 and 30* are semiconductor wafers, or portions of wafers. In some embodiments, substrates 30 and 30* include silicon, gallium arsenide, silicon on insulator ("SOI") or other similar materials. In some embodiments, substrates 30 and 30* also include passive devices such as resistors, capacitors, inductors and the like, or active devices such as transistors. In some Substrates 30 and 30*, in some exemplary embodiments, include additional integrated circuits. In some embodiments, substrates 30 and 30* include through substrate vias 35 and 35*, as shown in FIG. 1. In some embodiments, substrates 30 and 30* are interposers. In addition, the substrates 30 and 30* are of other materials, in alternative embodiments. For example, in some embodiments, multiple layer circuit boards are used. In some embodiments, substrates 30 and 30* also include bismaleimide triazine (BT) resin, FR-4 (a composite material composed of woven fiberglass cloth with an epoxy resin binder that is flame resistant), ceramic, glass, plastic, tape, film, or other supporting materials that may carry the conductive pads or lands needed to receive the connector terminals 15 and 15* for the flip chip integrated circuit dies 50 and 50*, respectively.

FIG. 1 shows IC die 50 is bonded to substrate 30 by connecting bumps 51 on IC die 50 to bumps 31 on substrate 30. Similarly, IC die 50* is bonded to substrate 30* by connecting bumps 51* on IC die 50* to bumps 31* on substrate 30*. The space between die 50 substrate 30 is filled with underfill 55. Similarly, the space between die 50* and substrate 30* is also filled with underfill 55*. Underfill 55*, made with an underfill material, fills substantially the entire space between IC die 50* and substrate 30*. In some embodiments, underfill 55* has continuous and tapered profiles. As described above, underfill 55* provides support for IC die 50* and prevents cracking of a joint solder 53* between bump structures 31* and 51*. The distance between IC die 50* and substrate 30*, $H_1^*$, is called the "standoff".

In contrast, underfill 55 does not fill the space between IC die 50 and substrate 30 and leaves a void 54 and a fillet 56, which is an extended thin piece of underfill under the void. Void 54 makes underfill 55 less effective in preventing cracks for solder, such as solder 53 near void 54. The fillet 56 is likely to detach from the remaining underfill 55, which could further weakens and damages underfill 55. The improper formation of underfill 55 is caused by higher standoff $H_1$, between IC die 50 and substrate 30, than standoff $H_1^*$, between IC die 50* and substrate 30*.

A same underfill process is used for packages 100 and 100*. The underfill process uses a set volume V of underfill material. Package 100 with higher standoff, $H_1$, makes the set volume V of underfill material insufficient to fill the space between IC die 50 and substrate 30, which results in the formation of void 54 and fillet 56. Packages with smaller standoffs have excess underfill that form large fillets, which affect proper underfill formation of neighboring dies. Therefore, controlling standoffs of packaged dies is important to obtain sufficiently durable chip packages.

Figure 2B:
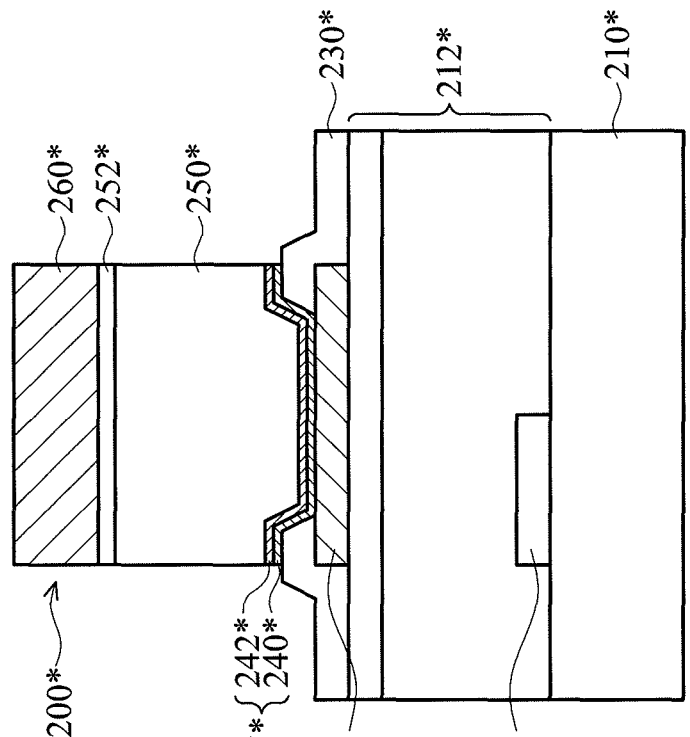
FIGS. 2A and 2B show two bump structures, in accordance with some embodiments.
Figure 2A:
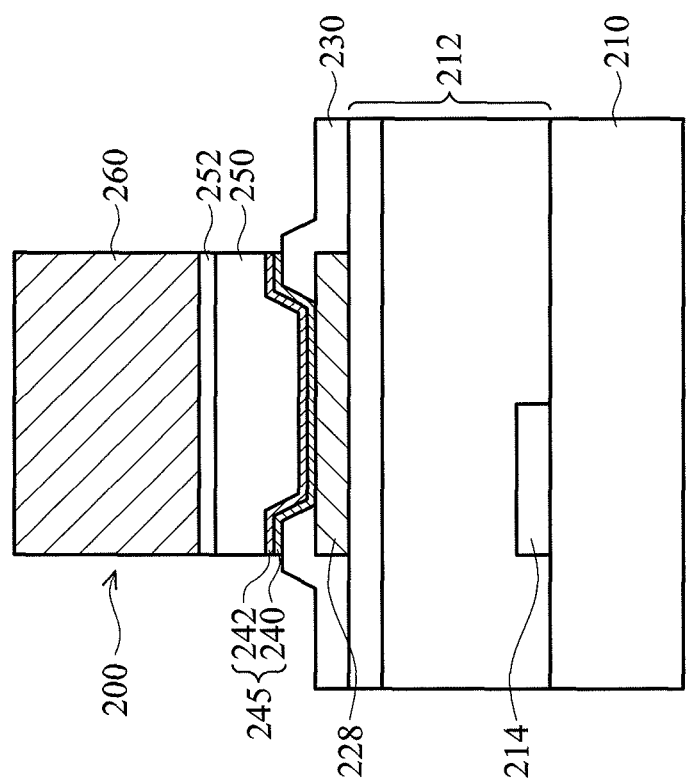

FIG. 2A shows a bump structure 200 with a substrate 210, in accordance with some embodiments. In some embodiments, substrate 210 is a semiconductor substrate, such as a bulk silicon substrate, although it may include other semiconductor materials, such as group III, group IV, and/or group V elements. In some embodiments, semiconductor devices 214, such as transistors, are formed at the surface of substrate 210. An interconnect structure 212, which includes metal lines and vias (not shown) formed therein and connected to semiconductor devices 214, is formed over substrate 210. In some embodiments, the metal lines and vias are formed of copper or copper alloys, and are formed using the well-known damascene processes. In some embodiments, interconnect structure 212 includes commonly known inter-layer dielectrics (ILDs) and inter-metal dielectrics (IMDs).

A metal pad 228 is formed over interconnect structure 212. In some embodiments, metal pad 228 comprises aluminum, and hence be referred to as aluminum pad 228. In other embodiments, metal pad 228 is formed of, or includes, other materials, such as copper, silver, gold, nickel, tungsten, alloys thereof, and/or multi-layers thereof. In some embodiments, metal pad 228 is electrically connected to semiconductor devices 214, for example, through underlying interconnection structure 212. In some embodiments, a passivation layer 230 is formed to cover edge portions of metal pad 228. In some embodiments, the passivation layer 230 is formed of polyimide or other known dielectric materials. In some embodiments, additional passivation layers are formed over interconnect structure 212 and at the same level, or over, metal pad 228. In some embodiments, the additional passivation layers are formed of materials such as silicon oxide, silicon nitride, un-doped silicate glass (USG), polyimide, and/or multi-layers thereof.

An opening is formed in passivation layer 230, exposing metal pad 228. A diffusion barrier layer 240 and a thin seed layer 242 cover the opening with the diffusion barrier layer 240 in contact with the metal pad 228. In some embodiments, diffusion barrier layer 240 is a titanium layer, a titanium nitride layer, a tantalum layer, or a tantalum nitride layer. In some embodiments, the materials of seed layer 242 include copper or copper alloys, and hence seed layer 242 is referred to as copper seed layer 242 hereinafter. In some embodiments, other metals, such as silver, gold, aluminum, and combinations thereof, are included in copper seed layer 242. In some embodiments, diffusion barrier layer 240 and copper seed layer 242 are formed using sputtering. The combined diffusion barrier layer 240 and thin seed layer 242 is referred to as an under bump metallurgy (UBM) layer 245.

A mask is over the copper seed layer 242 to allow a copper layer 250 to be plated on the exposed surface of copper seed layer 242, in accordance with some embodiments. In some embodiments, an optional metal layer 252 is on the copper layer 250. In some embodiments, metal layer 252 is a nickel-containing layer comprising, for example, a nickel layer or a nickel alloy layer. A solder layer 260 is over nickel layer 252. In some embodiments, solder layer 260 is a lead-free pre-solder layer formed of, for example, SnAg, or a solder material, including alloys of tin, lead, silver, copper, nickel, bismuth, or combinations thereof.

The mask is removed, exposing portions of copper seed layer 242 underlying the mask. The exposed portions of copper seed layer 242 are then removed by an etching process. Next, the exposed portions of diffusion barrier layer 240 are also removed. In FIG. 2A, the thickness of copper layer 250 is smaller than the thickness of solder layer 260; the bump structure is referred to as a solder bump 200.

The elements of FIG. 2B are similar to the elements of 2A. For example, a substrate 210* is similar to substrate 210; an interconnect structure 212* is similar to interconnect structure 212; a semiconductor device 214* is similar to semiconductor device 214; a metal pad 228* is similar to metal pad 228; a diffusion barrier layer 240* is similar to diffusion barrier layer 240; a seed layer 242* is similar to copper seed layer 242; a copper layer 250* is similar to copper layer 250; a metal layer 252* is similar to metal layer 252; and a solder layer 260* is similar to solder layer 260. The combination of the diffusion layer 240* and the thin seed layer 242* is called an UBM layer 245*. However, the thickness of copper layer 250* is larger than the thickness of the solder layer 260*, the bump structure is referred to as a copper post (or pillar) bump structure 200*, as shown in FIG. 2B in accordance with some embodiments.

The embodiment shown in FIGS. 2A and 2B are merely examples; other embodiments of bumps are also possible. Further details of bump formation process may be found in U.S. patent application Ser. No. 12/842,617, filed on Jul. 23, 2010 and entitled "Preventing UBM Oxidation in Bump Formation Processes," and U.S. patent application Ser. No. 12/846,353, filed on Jul. 29, 2010 and entitled "Mechanisms for Forming Copper Pillar Bumps," both of which are incorporated herein in their entireties.

Figure 3A:
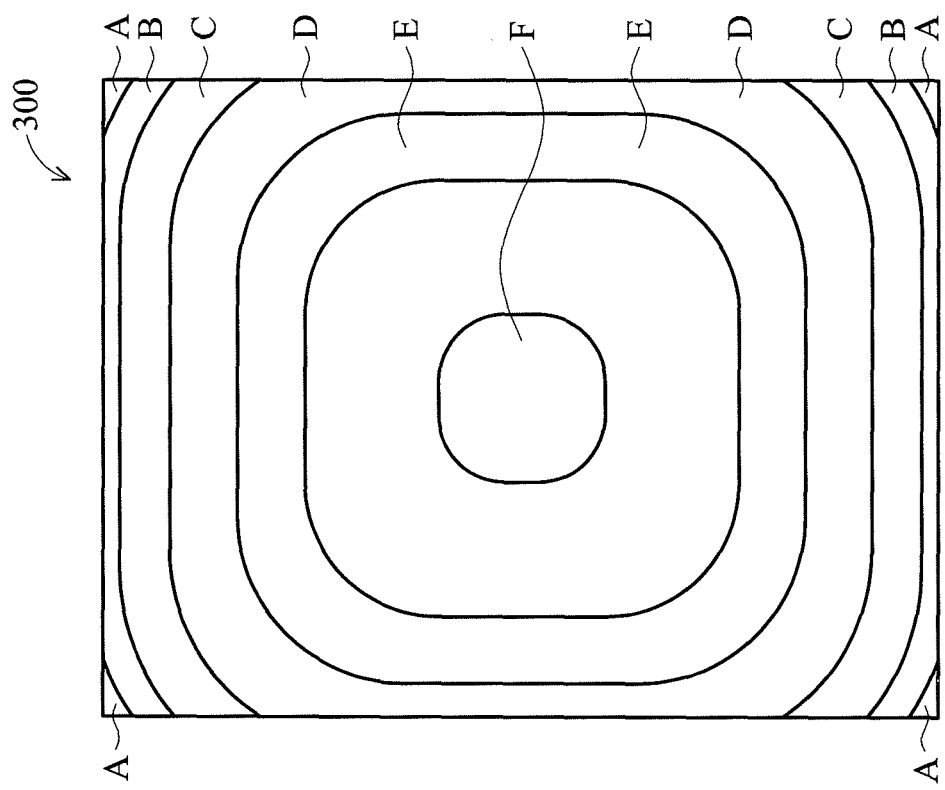
FIG. 3A shows standoff distribution of an IC chip, in accordance with some embodiments.

In some embodiments, copper layers 250 and 250*, metal layers 252 and 252*, and the solder layers 260 and 260* in FIGS. 2A and 2B are deposited by plating. The plating processes used to plate layers 250, 252, and 260 are electrochemical plating, which are affected by plating current density, pattern density of bumps, and size of chip. FIG. 3A show bump height distribution of an IC chip 300, in accordance with some embodiments. There are different regions, such as region A, B, C, D, E, F, and G of bump height measurement. The bump height measurement reflects the average value in each region. The bumps on IC chip 300 are fairly uniform across chip 300. The bump height distribution on chip 300 shows higher bump heights at the edges of chip 300 and lower bump heights at the center of chip 300. For example, region B has a bump height of about 25.3 μm and region D has a bump height of about 21.8 μm. Both regions B and C are close to the edges of die 300. In contrast, region G is near the center (or away from edges) of chip 300 and has the lowest bump heights of about 18.1 μm.

The large variation of bump heights from center to edges of IC chip 300 is attributed to current density variation across chip 300. The plating current density is highest at the edges and decreases toward the middle of chip 300. This is due to lack of pattern surrounding the edges. As a result, the current density is higher at edges of a chip. In addition, the depletion of plating chemistry near the center of a chip is also a factor.

FIG. 3B shows a cross sectional view of a chip 310 after the plating of solder layer is completed, in accordance with some embodiments. FIG. 3B shows bumps on chip 310 are similar to bump 200* of FIG. 2B, in accordance with some embodiments. The cross-sectional view of FIG. 3B shows chip 310 includes a number of copper pillar bumps, 311-316, which have the copper layer 250', the metal layer 252', and the solder layer 260'. In some embodiments, the width W of the copper layer is equal to less than about 30 μm. Copper layer 250', metal layer 252', and solder layer 260' are all deposited by plating in this embodiment. As shown in FIG. 3B, bumps 311 and 316 near the edges of the chip 310 are taller than bumps 313 and 314 near the center of chip 310.

FIG. 3C shows a cross sectional view of a substrate 320 after the plating of solder layer is completed, in accordance with some embodiments. FIG. 3C shows that substrate 320 has through silicon vias 328 under metal pad 327, in accordance with some embodiments. Substrate 320 is an interposer, in accordance with some embodiments. Bumps on chip 310 are similar to bump 200* of FIG. 2B, in accordance with some embodiments. Substrate 320 also has copper pillar structures 321-326, which have a copper layer 250", a metal layer 252", and solder layer 260". Copper layer 250", metal layer 252", and solder layer 260" are all deposited by plating in this embodiment. Copper pillar structures 321-326 of substrate 320 are used to bond copper pillar structures 311-316 of chip 310. The variation in bump heights from center to edges makes bonding difficult.

Figure 3D:
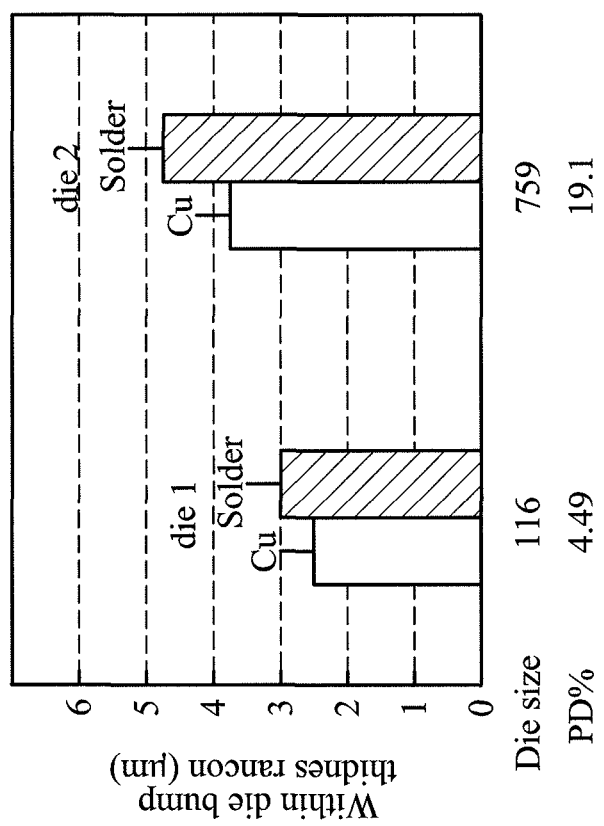
FIG. 3D compares thickness variation of a copper layer and a solder layer of two dies, in accordance with some embodiments.

As mentioned above, bump plating is also affected by the chip size and bump density. Chips with larger chip size and higher bump density have higher current density variation than chips with smaller chip size and lower bump density. In addition, a chemical depletion effect for chips that are larger and with higher bump densities is more severe. As a result, larger chips (or dies) and chips with higher bump densities have more significant bump height variation (center to edges) than chips that are smaller and with lower bump densities. FIG. 3D compares thickness variation of copper layer 250' and solder layer 260' of two dies, in accordance with some embodiments. One die has a die size of 116 mm$^2$ and a pattern density (PD) of 4.49% and the other has a die size of 759 mm$^2$ and a PD of 19.01%. Pattern density (PD) is defined as the ratio of surface of a die covered by patterns to the total surface area. Data in FIG. 3D show that higher die size and pattern density make thickness variation of copper layer 250' and solder layer 260' more pronounced.

In addition to within die variation, plating thickness also varies across the wafer. The plated thicknesses of bump structures are lower near the center of a wafer, in comparison to near the edge of the wafer. Further, plating process varies with the freshness of plating bath and also varies from plating system to system. The various factors described above increase the variation of standoff, which is the height between chips or between chip and substrate. Studies show, in some instances, within wafer (WIW) standoff variation of packaged chip is about 21 m or higher. As mentioned above, variation in standoff makes proper formation of underfill difficult and causes reliability or defect issues for packaged flip chip.

FIG. 4A shows the solder layer 260 of bumps 311-316 on chip 310 is planarized to achieve a targeted bump height, $H_{CT}$, above a surface of substrate 301 of chip 310, in accordance with some embodiments. The planarization enables removal of a portion of solder layer 260 to control the targeted bump height, $H_{CT}$. Such planarization reduces variation caused by the factors described above. In some embodiments, the planarization is achieved by grinding. In other embodiments, other planarization processes are used. In some embodiments, a height measuring device is used to monitor the height of bumps to enable controlled planarization of the solder layer 260 to reach the targeted height, $H_{CT}$. For example, in some embodiments, height measurement devices using confocal or triangulation height measurement methodology is used. Due to the planarization, the height of solder layer 260 near the center for chip 310, $H_C$, is larger than the height of solder layer 260 near the edge of chip 310, $H_E$.

FIG. 4B shows the solder layer 260" of bumps 321-326 on substrate 320 is planarized to achieve a targeted bump height, $H_{ST}$, above a surface of substrate 302 of substrate 320, in accordance with some embodiments. Similarly, the planarization enables removal of a portion of solder layer 260" to control the targeted bump height, $H_{ST}$. Such planarization reduces variation caused by the factors described above. In some embodiments, the planarization is achieved by grinding. In other embodiments, other planarization processes are used. In some embodiments, a height measuring device is used to monitor the height of bumps to enable controlled planarization of the solder layer 260" to reach the targeted height, $H_{ST}$. Due to the planarization, the height of solder layer 260" near the center for substrate 320, $H_{CC}$, is larger than the height of solder layer 260" near the edge of chip 310, $H_{EE}$.

Planarizing the solder layers of the bump structures, such as solder layers 260' and 260" described above, also reduces a surface roughness of the plated solder layer. Studies show, in some instances, non-planarized bump surfaces have a roughness in a range from about 442 nm to about 516 nm. After the planarization operation, the surface roughness is reduced to a range from about 3 nm to about 9 nm. Reduced solder surface roughness improves solder joint interface.

FIG. 4C shows the planarized bump structures of chip 310 being bonded to the bump structures of substrate 320, in accordance with some embodiments. In some embodiments, substrate 320 undergo further processing operations, such as grinding to expose the TSVs 328 and forming pads and passivation layer for external connections. The bonded package, as shown in FIG. 4C, has undergone a reflow process to join the solder layers. Due to the planarization, the total height of solder layer near the center of bonded package, $H_{TC}$, is larger than the total height of solder layer near the edge of chip 310, $H_{TE}$.

The planarization of the bump structures makes control of standoff, H, possible for the packaged structures in FIG. 4C possible. The planarization removes the variations across the die and across the wafer, caused by process, pattern density, and die size. For example, the standoff variation without planarizing the solder layers is in a range of about 20-25 μm. By planarizing the solder layers, standoff variation is reduced to equal to or less than about 3 μm. With consistent standoff from package to package, the underfill is formed properly and consistently.

Figure 5A:
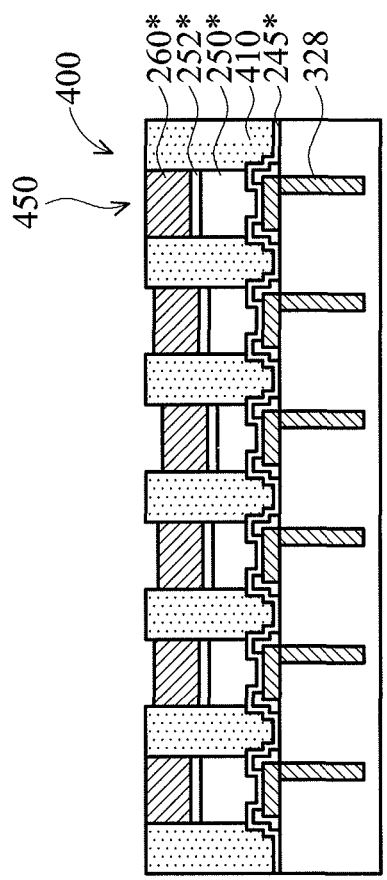
FIGS. 5A-5D show a process flow of preparing a chip package, in accordance with some embodiments.

FIG. 5A shows a cross-sectional view of a substrate 400 after a solder layer 260" is plated on the substrate, in accordance with some embodiments. The bump structure 450 in FIG. 5A includes a copper layer 250" and a metal layer 252". The copper layer 250", metal layer 252", and the solder layer 260" are plated on substrate 400 after a photoresist 410 is formed on substrate 400. The photoresist 410 is formed after a diffusion barrier layer 240" and a thin seed layer 242" are formed on substrate 400. In some embodiments, the photoresist is a wet photoresist or a dry photoresist. As mentioned above, the combination of the diffusion layer 240" and the thin seed layer 242" is called an UBM layer 245". All layers in FIG. 5A are described above with similar layer numbers. As described above, the bump height varies from center to the edges of substrate 400.

Figure 5B:
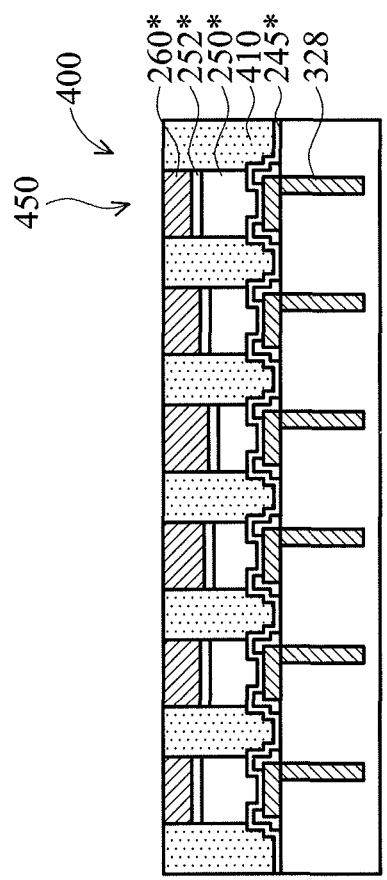
Figure 5C:
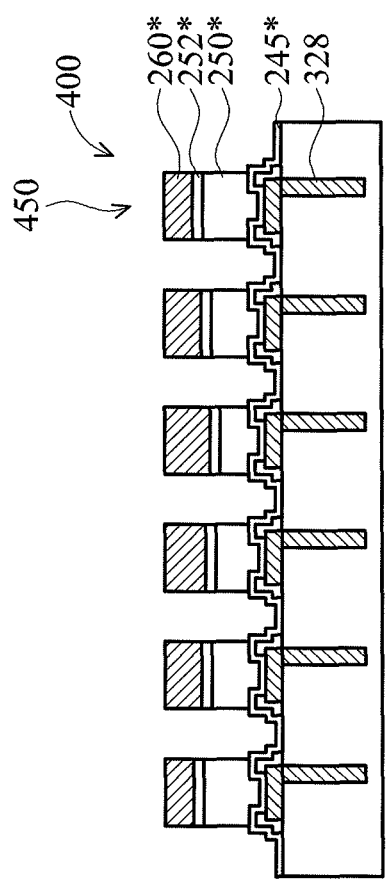

Afterwards, a planarization operation is performed. In some embodiments, prior to planarization, substrate 400 is secured to a holding workpiece to secure substrate 400 during planarization. FIG. 5B shows a cross sectional view of substrate 400 after the planarization operation, in accordance with some embodiments. Substrate 400 is planarized to a targeted thickness, $H_{ST}$. Afterwards, the photoresist layer 410 is removed and the exposed UBM layer 245 is removed by etching. FIG. 5C shows a cross sectional view of substrate 400 after the photoresist layer 410 is removed and the exposed UBM layer 245" is etched. The workpiece holding substrate 400 is then separated from substrate 400. In some embodiments, substrate 400 undergoes backside grinding to expose TSVs 328 and to form structures for external electrical connection. In some embodiments, substrate 400 includes a number of dies and the dies are sawed (or diced) and separated from substrate 400 to form individual die, in accordance with some embodiments.

Figure 5D:
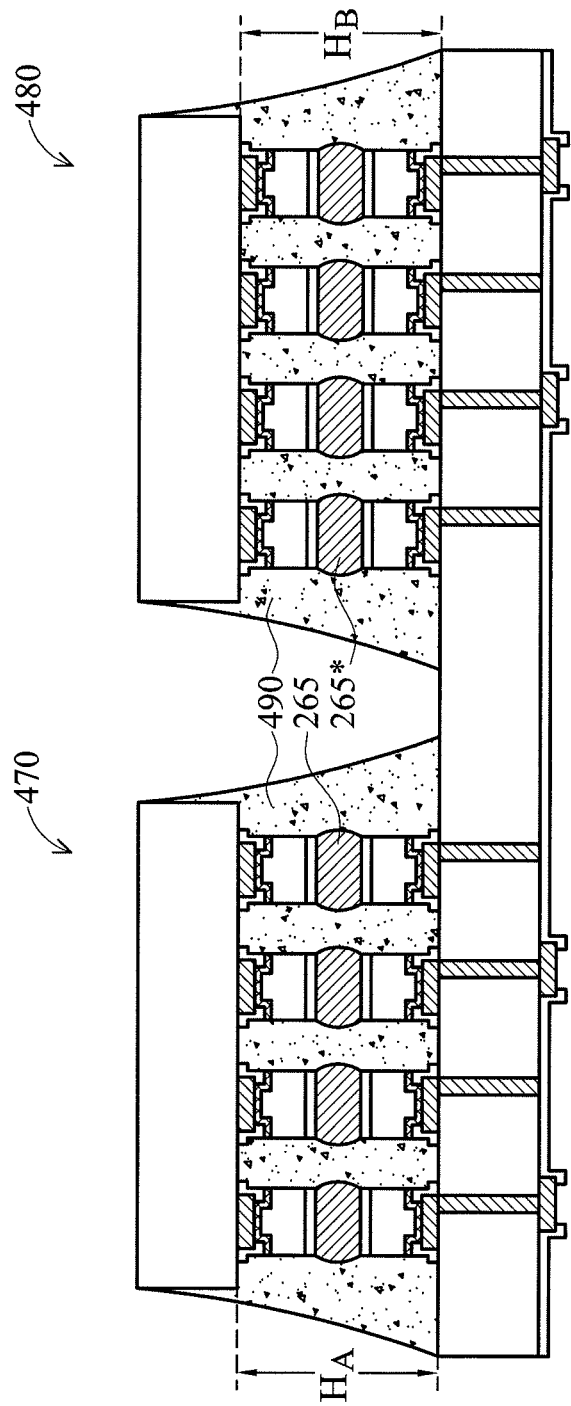

FIG. 5D shows two chips 470 and 480 after flip chip bonding. Similar planarization and bump formation operations are performed on chip 470, which is similar to chip 300 or 310 described above. The planarization removes portions of the solder layer on chip 470 to make the targeted bump height. After the bump structures of both substrate 400 and chip 470 are formed and planarized, chip 470 is bonded to substrate 400, as shown in FIG. 5D in accordance with some embodiments. FIG. 5D shows another chip 480 is also bonded to substrate 400. In some embodiments, chip 480 has a different size and pattern density from chip 470. However, by incorporating planarization in bump formation, the standoff $H_A$, between chip 470 and substrate 400, and the standoff $H_B$, between chip 480 and substrate 400, are about the same.

After chips 470 and 480 are placed on substrate 400, the set of components (including the substrate and chips) are reflowed. As a result, solder layers 265 and 265*, which are formed by reflowed solder layers from chips and substrate, are slightly rounded. Afterwards, a fixed volume of underfill 490 is applied between the space between chips 470, 480 and substrate 400. In some embodiments, a curing is performed to cure the underfill 490. Since the standoffs HA and HB are substantially the same, the underfill formation process is controlled and repeatable. Underfill 490 is formed properly, without voids or fillet.

Figure 5E:
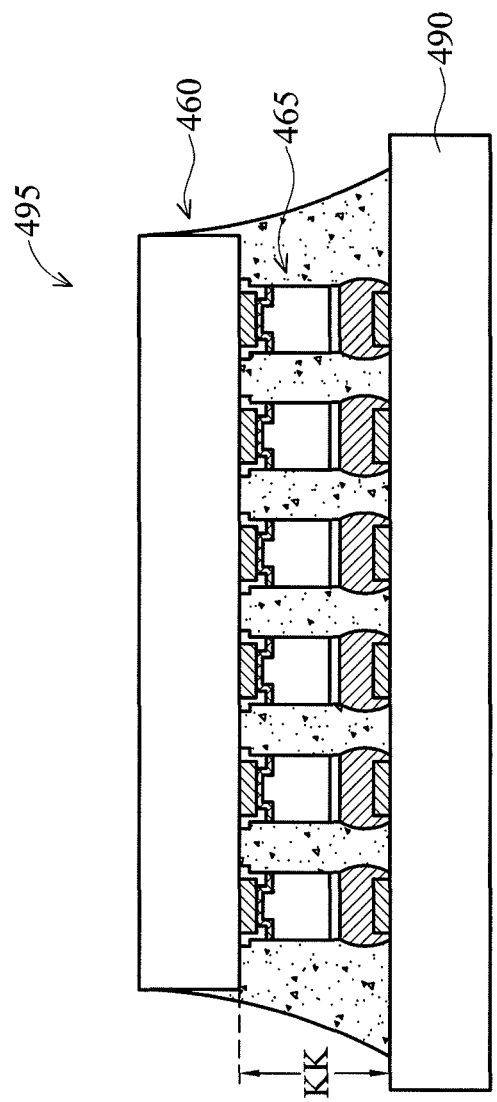
FIG. 5E shows a chip with bump structures, in accordance with some embodiments.

The exemplary chip packages described above involve chips on substrates with bump structures. However, in some embodiments, the application of planarizing bump structures is applied to chip packages involving chips on substrates without bump structures. FIG. 5E shows a chip 460 with bump structures 465, in accordance with some embodiments. Chip 460 is packaged on a substrate 490 with contact pads 491. Planarizing solder layer on bump structures 465 controls the standoff, $H_C$, of chip package 495.

The mechanisms for forming bump structures reduce variation of standoffs between chips and package substrates. By planarizing the solder layer on bump structures on chips and/or substrates after plating, the heights of bump structures is controlled to minimize variation due to within die and within wafer location, pattern density, die size, and process variation. As a result, the standoffs between chips and substrates are controlled and are more uniform. Consequently, underfill quality is improved.

One aspect of this description relates to a method of forming a plurality of bump structures on a substrate. The method includes forming an under bump metallurgy (UBM) layer on the substrate, wherein the UBM layer contacts metal pads on the substrate. The method further includes forming a photoresist layer over the UBM layer, wherein the photoresist layer defines openings for forming the plurality of bump structures. The method further includes plating a plurality of layers in the openings, wherein the metal layers are part of the plurality of bump structures. The method further includes planarizing the plurality of bump structures after the metal layers are plated to a targeted height from a surface of the substrate.

Another aspect of this description relates to a method of forming a chip package. The method includes providing a first chip with a first plurality of bump structures, wherein the first plurality of bump structures are planarized to a first height, and providing a substrate with a second plurality of bump structures, wherein the second plurality of bump structures are planarized to a second height. The method further includes bonding the first and second plurality of bump structures together, wherein the standoff between the first chip and the substrate is a value.

Still another aspect of this description relates to a method of forming a chip package. The method includes forming a plurality of bump structures on a first chip. Forming the plurality of bump structures includes forming a solder layer in each bump structure of the plurality of bump structures. A solder layer in a first bump structure of the plurality of bump structures near a center of the first chip is thicker than a solder layer in a second bump structure of the plurality of bump structures near an edge of the first chip, and a solder layer in a third bump structure of the plurality of bump structures positioned between the first bump structure and the second bump structure is thicker than the solder layer of the second bump structure and thinner than a solder layer of the first bump structure.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a plurality of bump structures on a substrate, comprising:
    forming an under bump metallurgy (UBM) layer on the substrate, wherein the UBM layer contacts metal pads on the substrate;
    forming a photoresist layer over the UBM layer, wherein the photoresist layer defines openings for forming the plurality of bump structures;
    plating a plurality of layers in each opening of the openings, wherein the layers are part of the plurality of bump structures, wherein a height of the plurality of layers in a corresponding opening of the openings varies from a center of the substrate to an edge of the substrate; and
    planarizing the plurality of bump structures after the layers are plated to a targeted height from a surface of the substrate.

2. The method of claim 1, wherein the plurality of layers comprises a copper layer, a metal layer, and a solder layer, wherein the metal layer is between the copper layer and the solder layer, and the copper layer contacts the UBM layer.

3. A method of forming a chip package, comprising:
    providing a first chip with a first plurality of bump structures, wherein the first plurality of bump structures are planarized to a first height;

providing a substrate with a second plurality of bump structures, wherein the second plurality of bump structures are planarized to a second height; and bonding the first and second plurality of bump structures together, wherein a standoff distance exists between the first chip and the substrate, and a thickness of a solder layer between a bump structure of the first plurality of bump structures to a corresponding bump structure of the second plurality of bump structures varies across the chip package.

4. The method of claim 3, further comprising underfilling a space between the first chip and the substrate with an underfill material.

5. The method of claim 3, further comprising:
providing a second chip with a third plurality of bump structures, wherein the third plurality of bump structures are planarized to a third height; and bonding the third plurality of bump structures with the second plurality of bump structures on the substrate, wherein a standoff height between the second chip and the substrate is substantially equal to the standoff distance.

6. The method of claim 5, wherein a fixed volume of underfill material is used to underfill a first space between the first chip and the substrate and to underfill a second space between the second chip and the substrate.

7. The method of claim 4, wherein the underfilling does not form a void or a fillet.

8. A method of forming a chip package, the method comprising:
forming a plurality of bump structures on a first chip, wherein forming the plurality of bump structures comprises:
forming a solder layer in each bump structure of the plurality of bump structures, wherein a solder layer in a first bump structure of the plurality of bump structures near a center of the first chip is thicker than a solder layer in a second bump structure of the plurality of bump structures near an edge of the first chip, and a solder layer in a third bump structure of the plurality of bump structures positioned between the first bump structure and the second bump structure is thicker than the solder layer of the second bump structure and thinner than a solder layer of the first bump structure.

9. The method of claim 8, wherein forming the plurality of bump structures comprises forming an under bump metallurgy (UBM) layer between a substrate of the first chip and the solder layer, wherein the UBM layer comprises a diffusion barrier layer and a seed layer, and the seed layer is between the diffusion barrier layer and the solder layer.

10. The method of claim 8, further comprising planarizing the solder layer in each bump structure of the plurality of bump structures.

11. The method of claim 10, wherein planarizing the solder layer comprises grinding the solder layer.

12. The method of claim 8, further comprising bonding the solder layer in each bump structure of the plurality of bump structures to a respective conductive structure on a substrate.

13. The method of claim 12, wherein bonding the solder layer comprises forming a standoff distance between the first chip and the substrate, and a variation of the standoff distance across the first chip is less than or equal to about 3 microns (μm).

14. The method of claim 12, wherein bonding the solder layer comprises bonding the solder layer to a respective contact pad on the substrate.

15. The method of claim 12, further comprises filling a space between the first chip and the substrate with an underfill material.

16. The method of claim 15, wherein filling the space comprising filling the space with the underfill material being free of voids or fillets.

17. The method of claim 8, further comprising forming a photoresist material between adjacent bump structures of the plurality of bump structures, wherein the photoresist material defines an opening above each bump structure of the plurality of bump structures.

18. The method of claim 17, wherein forming the solder layer comprises:
forming a solder material in the opening above each bump structure of the plurality of bump structures; and
planarizing the solder material to form the solder layer.

19. The method of claim 18, further comprising removing the photoresist layer between the adjacent bump structures of the plurality of bump structures, wherein the adjacent bump structures of the plurality of bump structures have the planarized solder material.

20. The method of claim 8, wherein forming the plurality of bump structures further comprises forming a copper layer in each bump structure of the plurality of bump structures, wherein a copper layer in a first bump structure of the plurality of bump structures near a center of the first chip is thinner than a copper layer in a second bump structure of the plurality of bump structures near an edge of the first chip, and a copper layer in a third bump structure of the plurality of bump structures positioned between the first bump structure and the second bump structure is thinner than the solder layer of the second bump structure and thicker than a solder layer of the first bump structure.

* * * * *